United States Patent
Ning

(10) Patent No.: US 9,799,679 B2
(45) Date of Patent: Oct. 24, 2017

(54) THIN FILM TRANSISTOR ARRAY SUBSTRATE, ITS MANUFACTURING METHOD AND DISPLAY DEVICE

(71) Applicant: BOE TECHNOLOGY GROUP CO., LTD., Beijing (CN)

(72) Inventor: Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 14/769,422

(22) PCT Filed: Oct. 31, 2014

(86) PCT No.: PCT/CN2014/089974
§ 371 (c)(1),
(2) Date: Aug. 20, 2015

(87) PCT Pub. No.: WO2016/029543
PCT Pub. Date: Mar. 3, 2016

(65) Prior Publication Data
US 2016/0293628 A1    Oct. 6, 2016

(30) Foreign Application Priority Data
Aug. 29, 2014 (CN) .......................... 2014 1 0438315

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1368* (2013.01); *G02F 1/133345* (2013.01);
(Continued)

(58) Field of Classification Search
CPC ... H01L 27/124; H01L 21/77; H01L 27/1225; G02F 1/133345; G02F 1/134309; G02F 1/136286; G02F 1/1368
(Continued)

(56) References Cited

U.S. PATENT DOCUMENTS 5,886,762 A * 3/1999 Lee .................. G02F 1/134363
                                              349/139
6,262,783 B1 * 7/2001 Tsuda ................ G02F 1/133553
                                              349/111
(Continued)

FOREIGN PATENT DOCUMENTS

CN       1881610 A      12/2006
CN     101123257 A       2/2008
(Continued)

OTHER PUBLICATIONS

First Office Action regarding Chinese Application No. 1014104383154 dated Jul. 6, 2016. Translation provided by Dragon Intellectual Property Law Firm.
(Continued)

*Primary Examiner* — Ori Nadav
(74) *Attorney, Agent, or Firm* — Harness, Dickey & Pierce, P.L.C.

(57) ABSTRACT

The present disclosure provides a thin film transistor (TFT) array substrate, its manufacturing method and a display device. The method includes steps of: forming patterns of a common electrode, a common electrode line, a gate line and a data line on a substrate by a single patterning process; forming an insulating layer; forming a pattern of an active layer by a single patterning process; forming a gate insulating layer and forming via-holes corresponding to the gate line, the data line and the active layer in the gate insulating layer by a single patterning process; and forming patterns of a pixel electrode, a gate electrode, a source electrode and a drain electrode by a single patterning process.

11 Claims, 12 Drawing Sheets

(51) Int. Cl.
*H01L 21/77* (2017.01)
*G02F 1/1333* (2006.01)
*G02F 1/1343* (2006.01)
*G02F 1/1362* (2006.01)
*H01L 29/786* (2006.01)

(52) U.S. Cl.
CPC .. *G02F 1/134309* (2013.01); *G02F 1/136286* (2013.01); *H01L 21/77* (2013.01); *H01L 27/127* (2013.01); *H01L 27/1225* (2013.01); *H01L 27/1288* (2013.01); *H01L 29/7869* (2013.01); *G02F 1/13439* (2013.01); *G02F 2001/134318* (2013.01); *G02F 2001/136295* (2013.01); *G02F 2201/121* (2013.01); *H01L 27/12* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 6,486,933 B1* | 11/2002 | Cha | ................... | G02F 1/134363 349/110 |
| 7,116,383 B2* | 10/2006 | Kim | ................... | G02F 1/13458 349/111 |
| 7,190,421 B2* | 3/2007 | Hong | ................ | G02F 1/136209 349/106 |
| 7,427,540 B2* | 9/2008 | Liao | ...................... | H01L 27/124 257/E27.111 |
| 7,821,009 B2* | 10/2010 | Park | ........................ | H01L 27/12 257/59 |
| 8,253,905 B2* | 8/2012 | Lu | ......................... | H01L 27/124 349/139 |
| 8,830,437 B2* | 9/2014 | Ahn | .................. | G02F 1/134363 345/104 |
| 2014/0097411 A1 | 4/2014 | Choi | | |

FOREIGN PATENT DOCUMENTS

| | | |
|---|---|---|
| CN | 102023424 A | 4/2011 |
| CN | 103018974 A | 4/2013 |
| CN | 103227147 A | 7/2013 |
| JP | 2008287295 A | 11/2008 |

OTHER PUBLICATIONS

International Search Report and Written Opinion of the International Searching Authority regarding International Application No. PCT/CN2014/089974, dated May 25, 2015. Translation provided by Dragon Intellectual Property Law Firm.

\* cited by examiner

THIN FILM TRANSISTOR ARRAY SUBSTRATE, ITS MANUFACTURING METHOD AND DISPLAY DEVICE

CROSS-REFERENCE TO RELATED APPLICATION

The present application is the U.S. national phase of PCT Application No. PCT/CN2014/089974 filed on Oct. 31, 2014, which claims a priority of the Chinese patent application No. 201410438315.4 filed on Aug. 29, 2014, which is incorporated herein by reference in its entirety.

TECHNICAL FIELD

The present disclosure relates to the field of display technology, in particular to a thin film transistor (TFT) array substrate, its manufacturing method and a display device.

BACKGROUND

For a liquid crystal panel with an advanced super dimension switch (ADS) display mode, a multi-dimensional electric field is formed by electric fields generated at edges of electrodes in an identical plane and an electric field generated between an electrode layer and a plate-like electrode layer, so as to enable all liquid crystal molecules between the electrodes and right above the electrodes to be deflected. The liquid crystal panel with the ADS display mode has such advantages as high image quality, high resolution, high transmittance, low power consumption, wide viewing angle, high aperture ratio, low chromatic aberration, and being free of push Mura.

However, for an existing method for manufacturing a TFT array substrate with the ADS display mode, its patterning process is complex and the production cost thereof is relatively high.

SUMMARY

An object of the present disclosure is to provide a TFT array substrate, its manufacturing method and a display device, so as to simply a patterning process of an existing method for manufacturing the TFT array substrate, and reduce the production cost thereof.

In one aspect, the present disclosure provides in one embodiment a method for manufacturing a TFT array substrate, including steps of: forming patterns of a common electrode, a common electrode line, a gate line and a data line on a substrate by a single patterning process, the common electrode line being connected to the common electrode, the data line being interrupted at a joint between the data line and the gate line and at a joint between the data line and the common electrode line so as to form a plurality of data line segments which belongs to a complete data line; forming an insulating layer on the substrate with the common electrode, the common electrode line, the gate line and the data line; forming a pattern of an active layer on the substrate with the insulating layer by a single patterning process; forming a gate insulating layer on the substrate with the pattern of the active layer, and forming in the gate insulating layer a first via-hole corresponding to the gate line, a plurality of second via-holes corresponding to the data line segments, and two third via-holes corresponding to the active layer; and forming patterns of a pixel electrode, a gate electrode, a source electrode and a drain electrode on the substrate with the gate insulating layer by a single patterning process, the gate electrode being electrically connected to the gate line through the first via-hole, the data line segments being electrically connected to each other through the plurality of second via-holes to form a complete data line, the data line being electrically connected to the source electrode through one of the plurality of second via-holes, the source electrode being electrically connected to the active layer through one of the two third via-holes, and the drain electrode being electrically connected to the active layer through the other one of the two third via-holes.

Alternatively, the step of forming the patterns of the common electrode, the common electrode line, the gate line and the data line on the substrate by a single patterning process includes: forming a first transparent conductive film and a first metal film sequentially on the substrate; applying a photoresist onto the first metal film; exposing and developing the photoresist with a gray-tone or half-hone mask plate, so as to form a photoresist reserved region corresponding to a region where the patterns of the common electrode line, the gate line and the data line are located, a photoresist partially-reserved region corresponding to a region where the common electrode is located, and a photoresist unreserved region corresponding to a region other than the photoresist reserved region and the photoresist partially-reserved region; etching off the first metal film and the first transparent conductive film at the photoresist unreserved region by an etching process; removing the photoresist at the photoresist partially-reserved region by an ashing process; etching off the first metal film at the photoresist partially-reserved region by an etching process, so as to form the pattern of the common electrode; and removing the photoresist at the photoresist reserved region so as to expose the patterns of the common electrode line, the gate line and the data line.

Alternatively, the first metal film is made of a copper-based metal.

Alternatively, the copper-based metal is selected from the group consisting of copper, a copper-molybdenum alloy, a copper-titanium alloy, a copper-molybdenum-tungsten alloy, a copper-molybdenum-niobium alloy and a copper-molybdenum-titanium alloy.

Alternatively, the step of forming the patterns of the pixel electrode, the gate electrode, the source electrode and the drain electrode on the substrate with the gate insulating layer by a single patterning processing includes: forming a second transparent conductive film and a second metal film sequentially on the substrate with the gate insulating layer; applying a photoresist onto the second metal film; exposing and developing the photoresist with a gray-tone or half-hone mask plate, so as to form a photoresist reserved region corresponding to a region where the patterns of the gate electrode, the source electrode, the drain electrode and connection parts of the data line are located, a photoresist partially-reserved region corresponding to a region where the pattern of the pixel electrode is located, and a photoresist unreserved region corresponding to a region other than the photoresist reserved region and the photoresist partially-reserved region; etching off the second metal film and the second transparent conductive film at the photoresist unreserved region by an etching process; removing the photoresist at the photoresist partially-reserved region by an ashing process; etching off the second metal film at the photoresist partially-reserved region by an etching process, so as to form the pattern of the pixel electrode; and removing the photoresist at the photoresist reserved region, so as to expose the patterns of the gate electrode, the source electrode, the drain electrode and the connection parts of the data line, the data line segments being electrically connected to each other through the plurality of second via-holes using the connection parts of the data line so as to form a complete data line.

In another aspect, the present disclosure provides in one embodiment a TFT array substrate, including: a substrate; a common electrode arranged on the substrate; a common electrode line, a gate line and a data line arranged at an identical layer, the common electrode line being arranged on the common electrode, and the data line being interrupted at a joint between the data line and the gate line and at a joint between the data line and the common electrode line so as to form a plurality of data line segments which belongs to a complete data line; a first transparent conductive film reservation member arranged between the substrate and the gate line and the data line, arranged at a layer identical to the common electrode and made of a material identical to the common electrode; an insulating layer covering the common electrode, the common electrode line, the gate line and the data line; an active layer arranged on the insulating layer; a gate insulating layer covering the active layer, a first via-hole corresponding to the gate line, a plurality of second via-holes corresponding to the data line segments, and two third via-holes corresponding to the active layer being provided in the gate insulating layer; a pixel electrode arranged on the gate insulating layer; a gate electrode, a source electrode, a drain electrode and connection parts of the data line arranged at an identical layer, the data line segments being electrically connected to each other through the plurality of second via-holes using the connection parts of the data line so as to form a complete data line, the data line being connected to the source electrode through one of the plurality of second via-holes; and a second transparent conductive film reservation member arranged between the gate insulating layer and the gate electrode, the source electrode, the drain electrode and the connection parts of the data line, arranged at a layer identical to the pixel electrode and made of a material identical to the pixel electrode, the gate electrode being electrically connected to the gate line through the first via-hole using the second transparent conductive film reservation member under the gate electrode, the source electrode being electrically connected to the active layer through one of the two third via-holes using the second transparent conductive film reservation member under the source electrode, and the drain electrode being electrically connected to the active layer through the other one of the two third via-holes using the second transparent conductive film reservation member under the drain electrode.

Alternatively, the common electrode line, the gate line and the data line are each made of a copper-based metal.

Alternatively, the copper-based metal is selected from the group consisting of copper, a copper-molybdenum alloy, a copper-titanium alloy, a copper-molybdenum-tungsten alloy, a copper-molybdenum-niobium alloy and a copper-molybdenum-titanium alloy.

In yet another aspect, the present disclosure provides in one embodiment a display device including the above-mentioned TFT array substrate.

According to the embodiments of the present disclosure, the array substrate with a top-gate TFT may be manufactured merely by four patterning processes. As a result, it is able to simplify the manufacture process and reduce the production cost. In addition, the copper-based metal is adopted to form the wires, so it is able to improve the yield of the product, and present the performance of the TFT from being adversely affected due to the diffusion of copper.

BRIEF DESCRIPTION OF THE DRAWINGS

FIG. 6-1 to FIG. 6-7 are schematic views showing methods for manufacturing a common electrode, a common electrode line, a gate line and a data line according to one embodiment of the present disclosure;

FIG. 7-1 to 7-7 are schematic views showing methods for manufacturing a pixel electrode, a gate electrode, a source electrode and a drain electrode according to one embodiment of the present disclosure.

DETAILED DESCRIPTION

In order to make the objects, the technical solutions and the advantages of the present disclosure more apparent, the present disclosure will be described hereinafter in conjunction with the drawings and embodiments.

The present disclosure provides a method for manufacturing a top-gate TFT array substrate, which includes the following steps.

Figure 1:
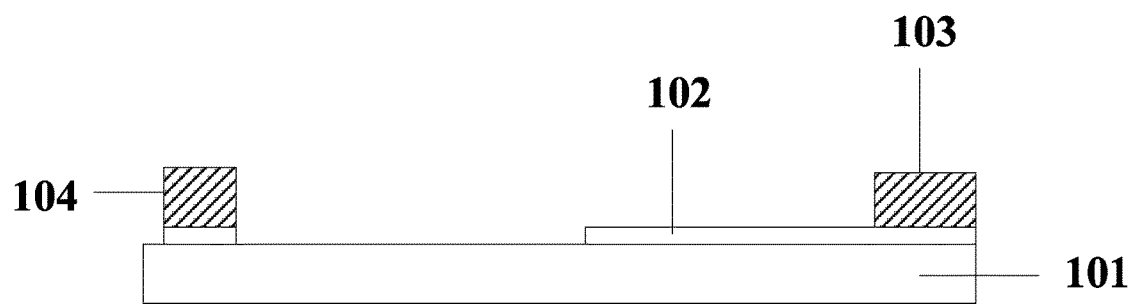
FIG. 1-1 to FIG. 5-2 are schematic views showing a method for manufacturing a TFT array substrate according to one embodiment of the present disclosure.
Figures 1, 2:
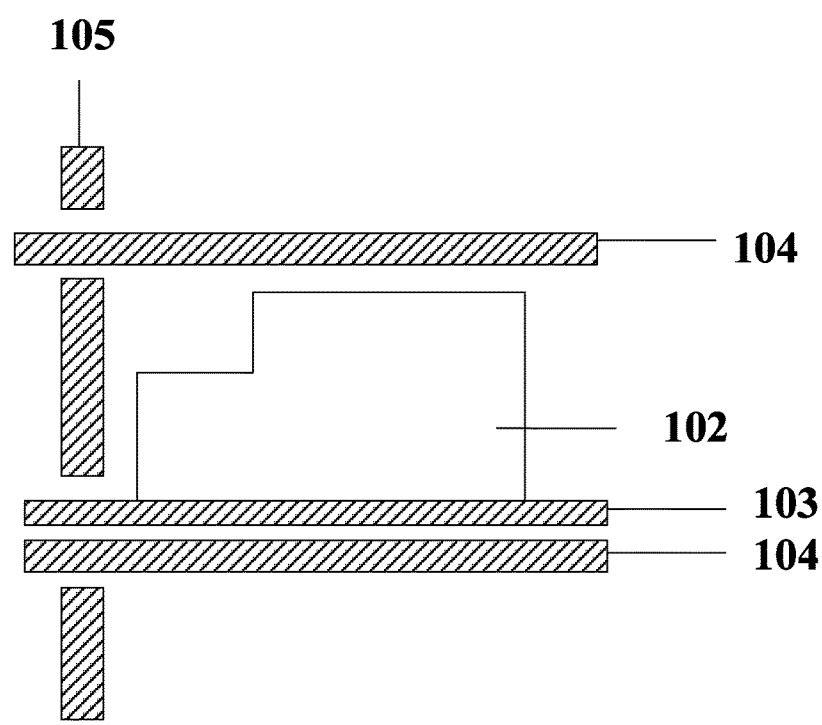
Figure 2:
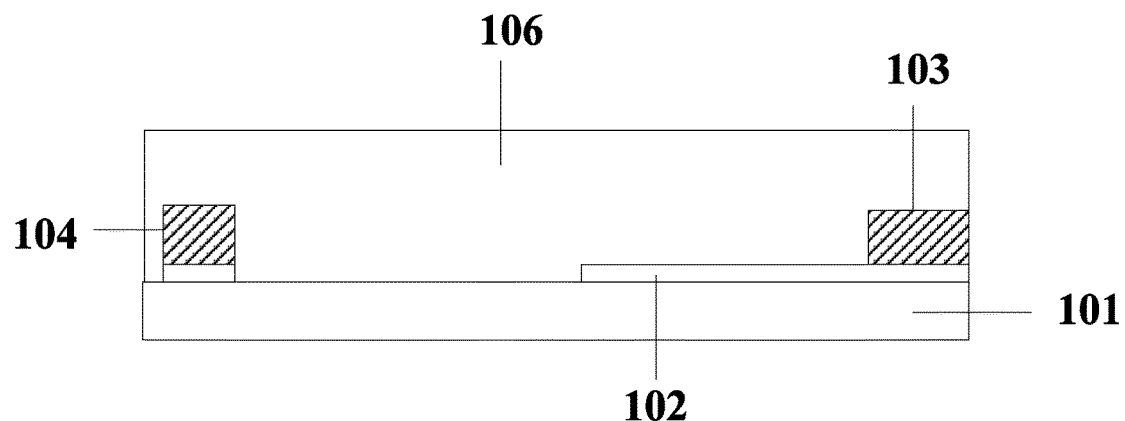

Step S1: referring to FIGS. 1-1 and 1-2, forming patterns of a common electrode 102, a common electrode line 103, a gate line 104 and a data line 105 on a substrate 101 by a single patterning process. The common electrode line 103 is connected to the common electrode 102, the data line 105 is interrupted at a joint between the data line 105 and the gate line 104 and at a joint between the data line 105 and the common electrode line 103 so as to form a plurality of data line segments which belongs to a complete data line. The substrate 101 may merely include a base substrate, or include the base substrate and any other layer (e.g., a buffer layer). The base substrate may be a glass substrate.

Step S2: referring to FIG. 2, forming an insulating layer 106 on the substrate 101 with the common electrode 102, the common electrode line 103, the gate line 104 and the data line 105 (not shown). The insulating layer 106 may be of a thickness of 200 to 400 nm, and may be a layer of SiNx, a layer of $SiO_2$, or a combination thereof.

Figures 1, 3:
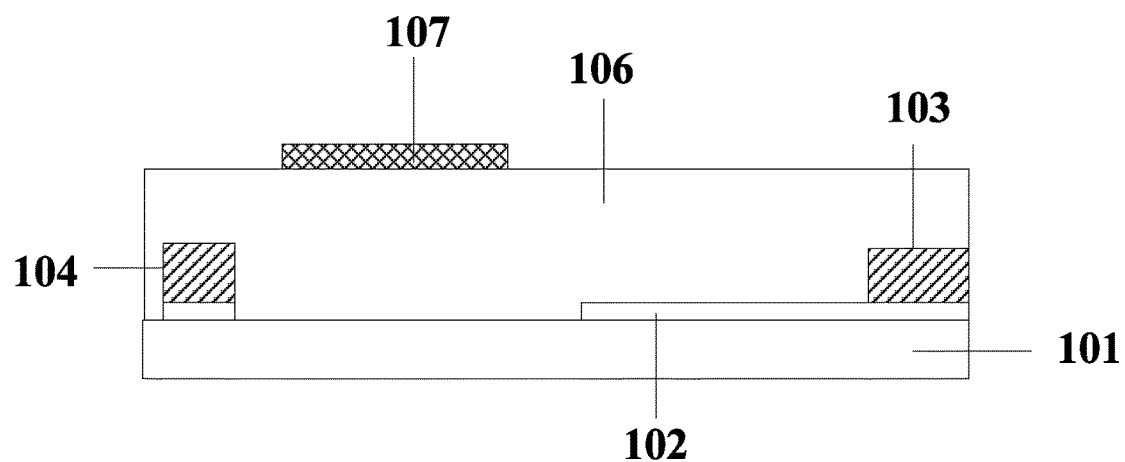
Figures 2, 3:
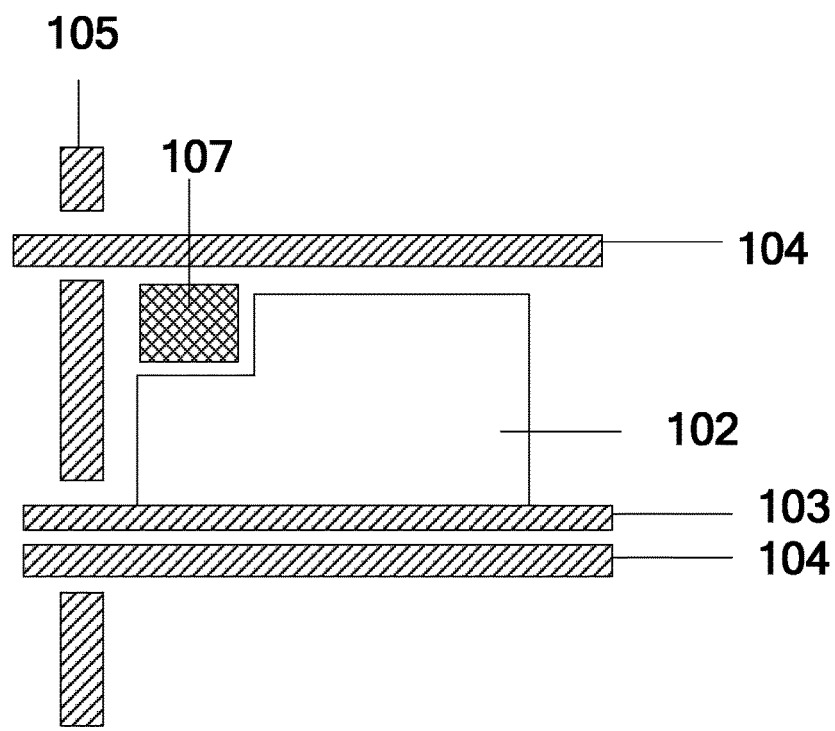

Step S3: referring to FIGS. 3-1 and 3-2, forming a pattern of an active layer 107 on the substrate 101 with the insulating layer 106 by a single patterning process. The active layer 107 may be of a thickness of 30 to 50 nm, and made of an oxide, such as IGZO, ZnO, InO, ITZO or IAZO, or a-Si.

Figures 1, 4:
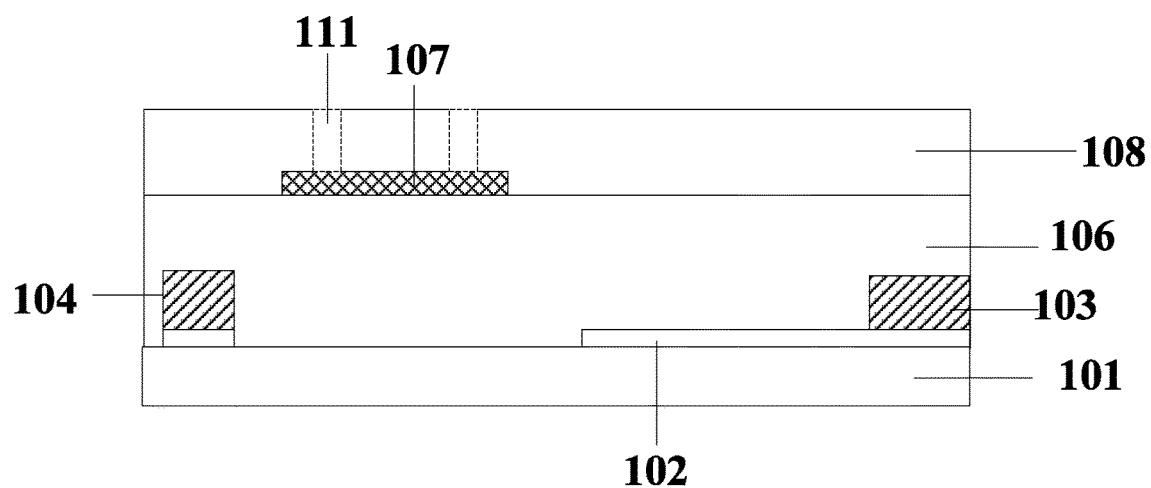
Figures 2, 4:
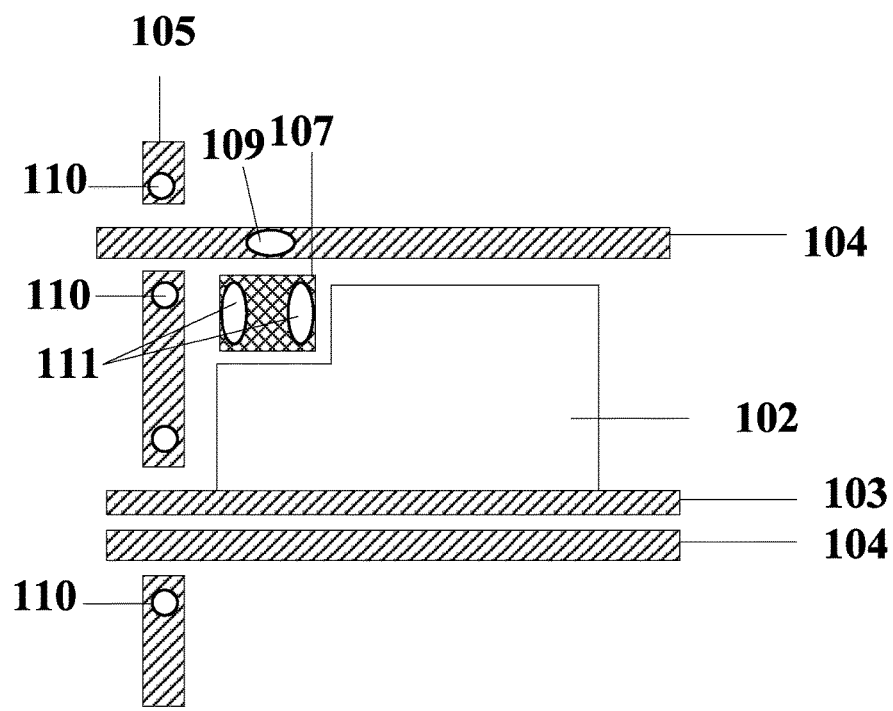

Step S4: referring to FIGS. 4-1 and 4-2, forming a gate insulating layer 108 on the substrate 101 with the pattern of the active layer 107, and forming in the gate insulating layer 108 a first via-hole 109 corresponding to the gate line 104, a plurality of second via-holes 110 corresponding to the data line segments, and two third via-holes 111 corresponding to the active layer 107 by a single patterning process. The gate insulating layer 108 may be deposited by plasma enhanced chemical vapor deposition (PECVD), and may be of a thickness of 200 to 400 nm.

Figures 1, 5:
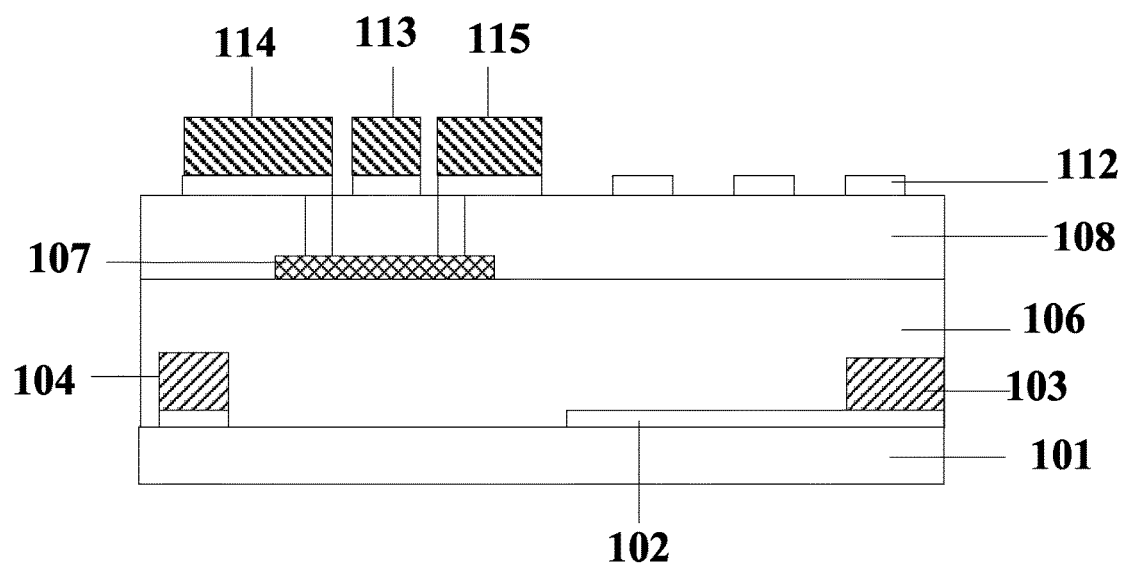
Figures 2, 5:
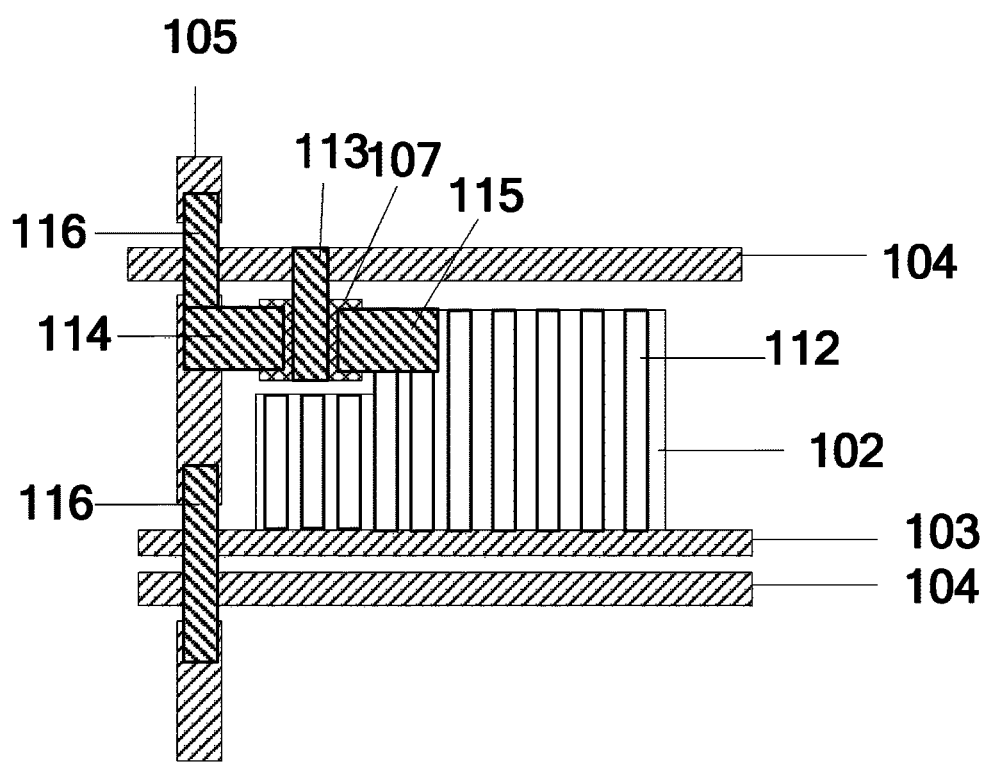

Step S5: referring to FIGS. 5-1 and 5-2, forming patterns of a pixel electrode 112, a gate electrode 113, a source electrode 114 and a drain electrode 115 on the substrate with the gate insulating layer 108 by a single patterning process. The gate electrode 113 is electrically connected to the gate line 104 through the first via-hole 109, the data line segments are electrically connected to each other through the plurality of second via-holes 110 to form a complete data line 105, the data line 105 is electrically connected to the source electrode 114 through one of the plurality of second via-holes 110, the source electrode 114 is electrically connected to the active layer 107 through one of the two third via-holes 111, and the drain electrode 115 is electrically connected to the active layer 107 through the other one of the two third via-holes 111.

According to the above-mentioned method, the top-gate TFT array substrate may be manufactured by merely four patterning processes, so it is able to simplify the manufacture process, and reduce the production cost.

Figures 1, 6:
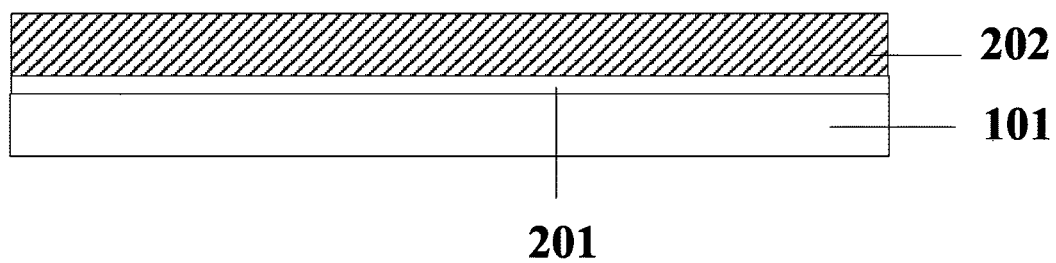
Figures 2, 6:
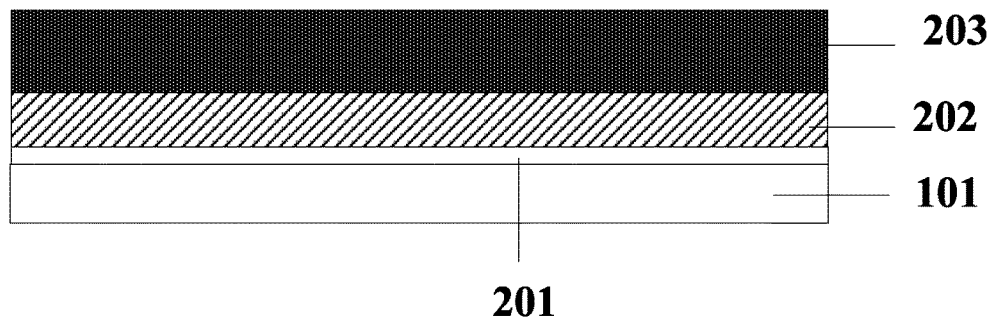
Figures 3, 6:
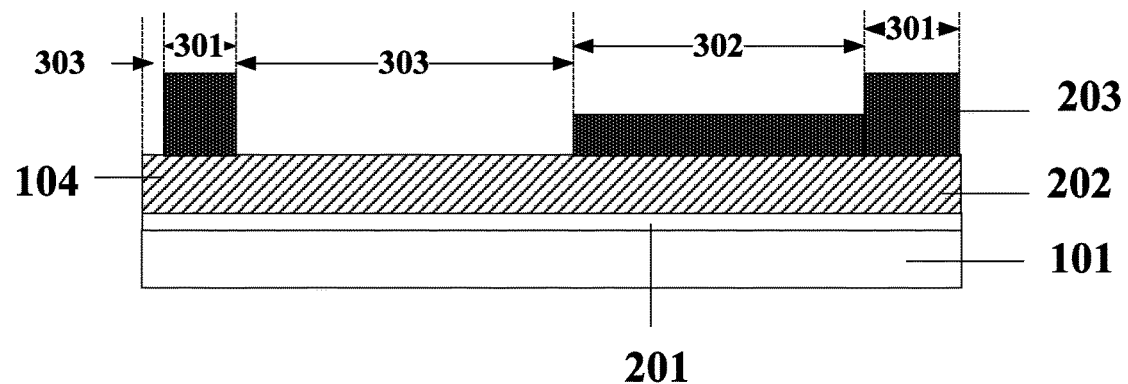
Figures 4, 6:
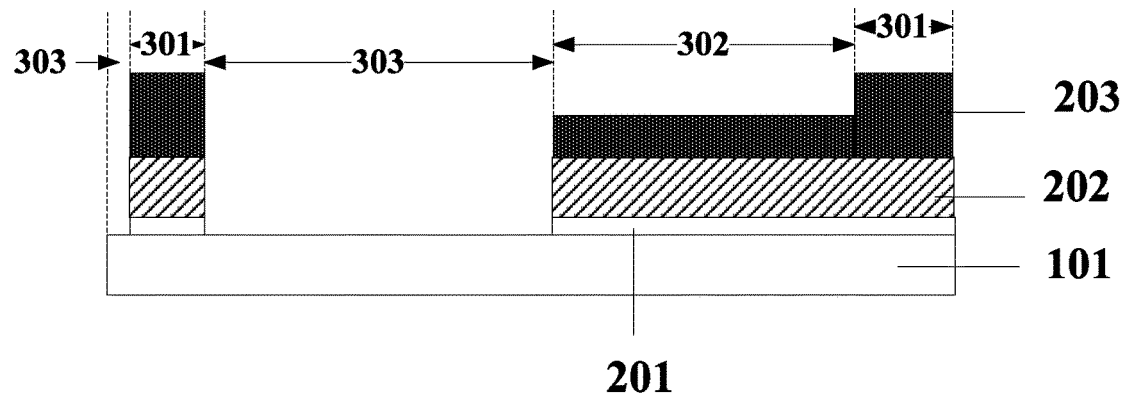
Figures 5, 6:
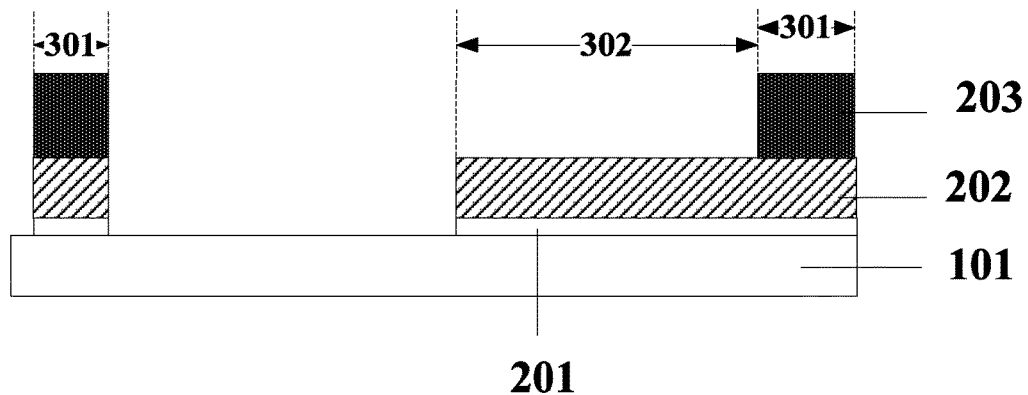
Figure 6:
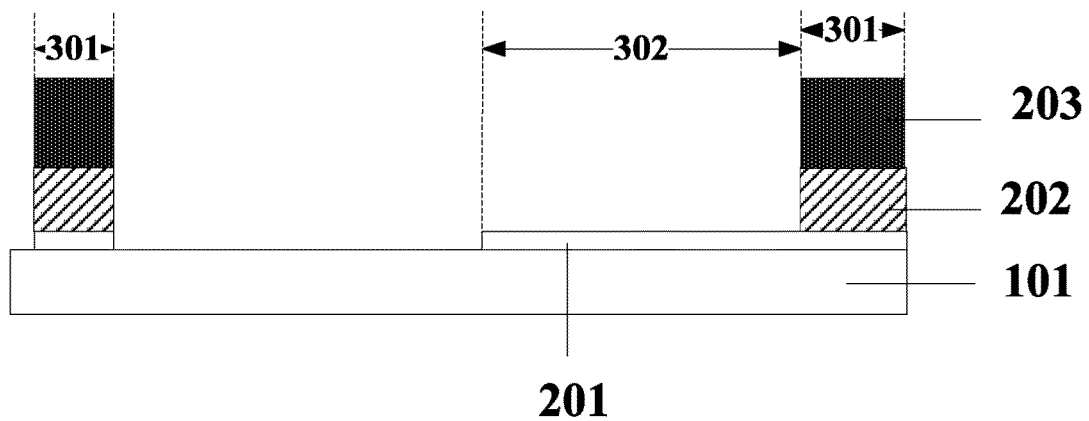

Step S1 of forming the patterns of the common electrode 102, the common electrode line 103, the gate line 104 and the data line 105 on the substrate 101 by a single patterning process may include:

Step S11: referring to FIG. 6-1, forming a first transparent conductive film 201 and a first metal film 202 sequentially on the substrate 101. To be specific, the first transparent conductive film 201 may be made of a metal oxide such as ITO, IZO or AZO, deposited by magnetron sputtering, and have a thickness of 30 to 50 nm. In addition, the first metal film 202 may also be deposited by magnetron sputtering, and have a thickness of 200 to 400 nm.

Step S12: referring to FIG. 6-2, applying a photoresist 203 onto the first metal film 202.

Step S13: referring to FIG. 6-3, exposing and developing the photoresist 203 with a gray-tone or half-hone mask plate, so as to form a photoresist reserved region 301 corresponding to a region where the patterns of the common electrode line 103, the gate line 104 and the data line 105 are located, a photoresist partially-reserved region 302 corresponding to a region where the common electrode 102 is located, and a photoresist unreserved region 303 corresponding to a region other than the photoresist reserved region 301 and the photoresist partially-reserved region 302.

Step S14: referring to FIG. 6-4, etching off the first metal film 202 and the first transparent conductive film 201 at the photoresist unreserved region 303 by an etching process. At this step, a wet etching process may be adopted.

Step S15: referring to FIG. 6-5, removing the photoresist 203 at the photoresist partially-reserved region 302 by an ashing process.

Step S16: referring to FIG. 6-6, etching off the first metal film 202 at the photoresist partially-reserved region 302 by an etching process, so as to form the pattern of the common electrode 102. At this step, a wet etching process may be adopted.

Figures 6, 7:
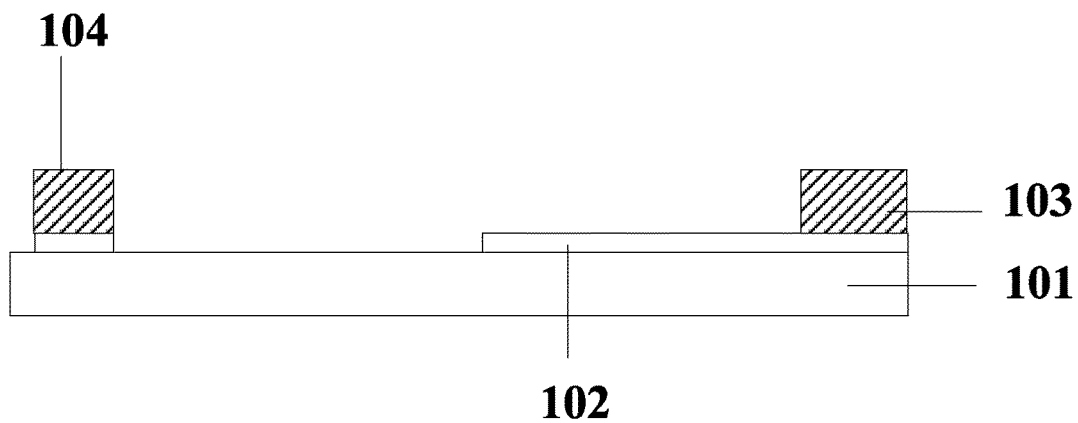
Figures 1, 7:
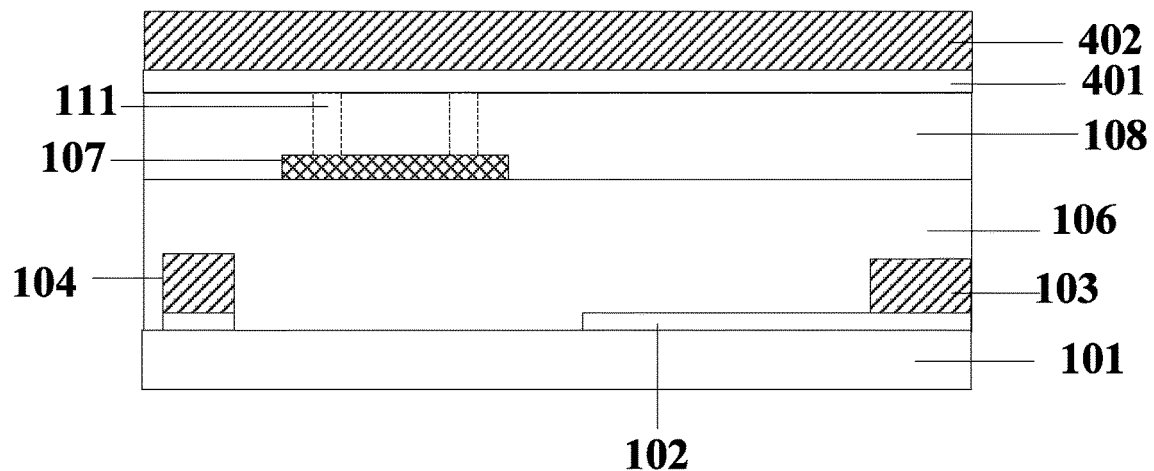
Figures 2, 7:
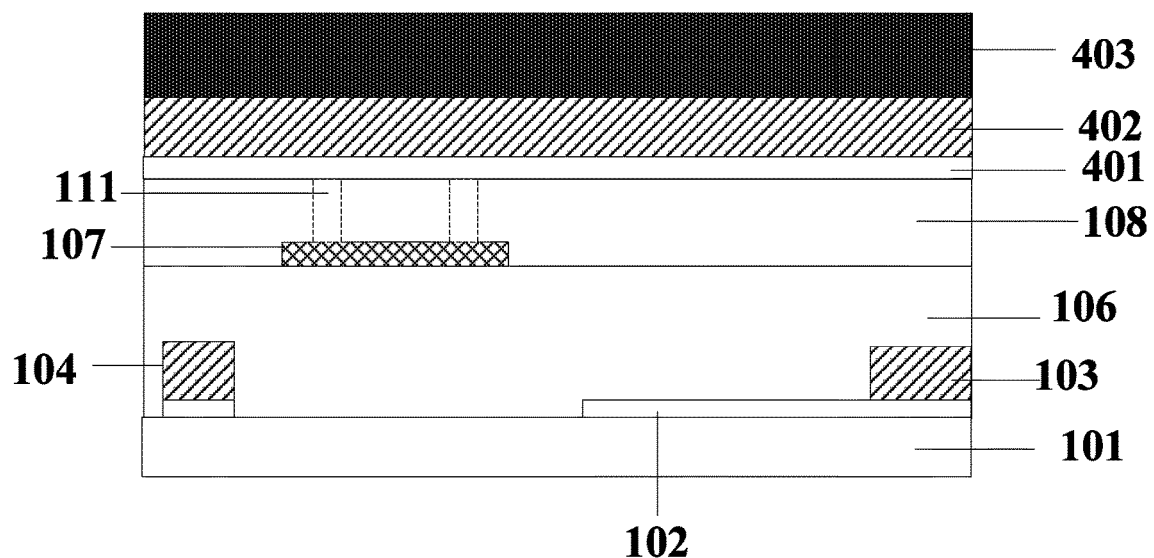
Figures 3, 7:
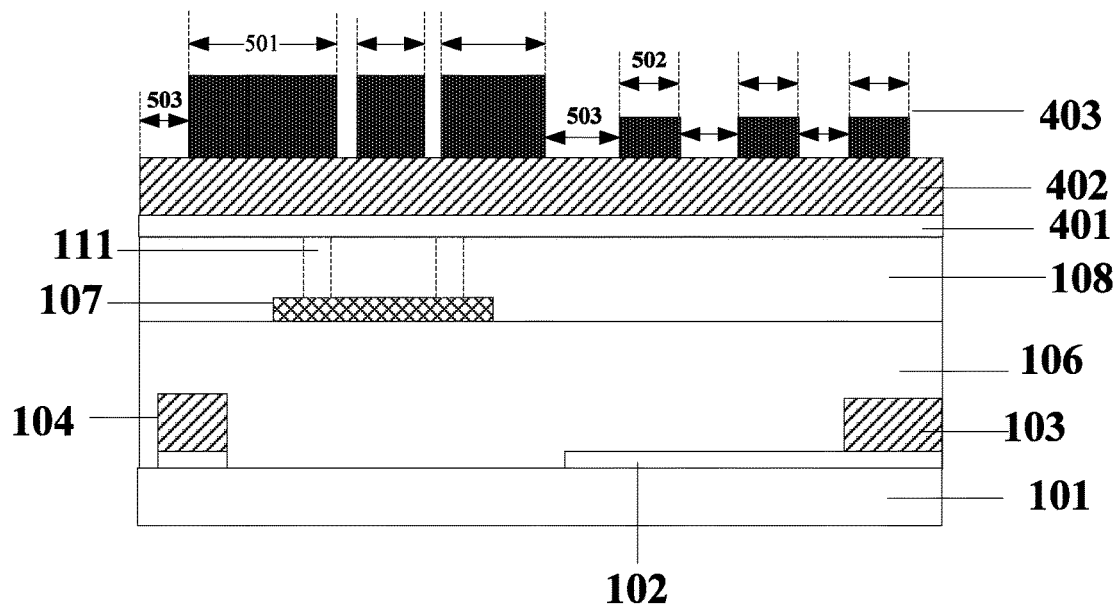
Figures 4, 7:
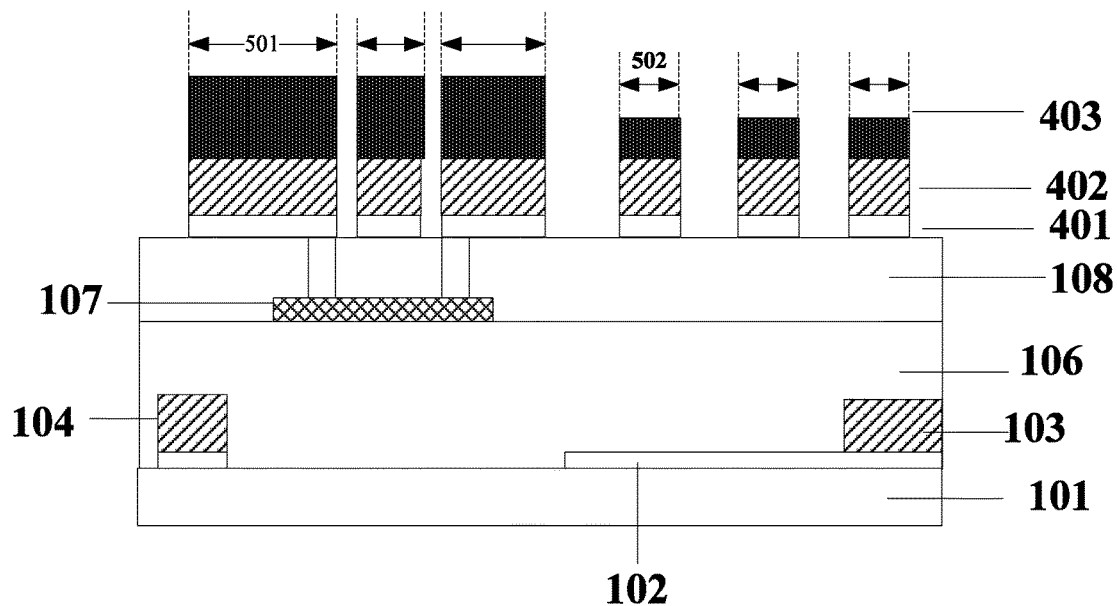
Figures 5, 7:
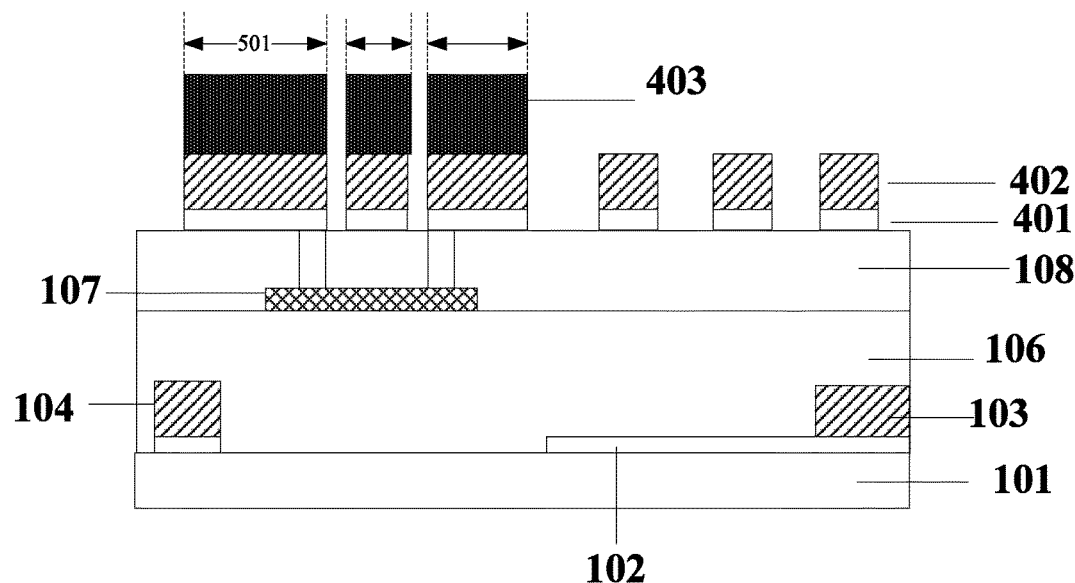
Figures 6, 7:
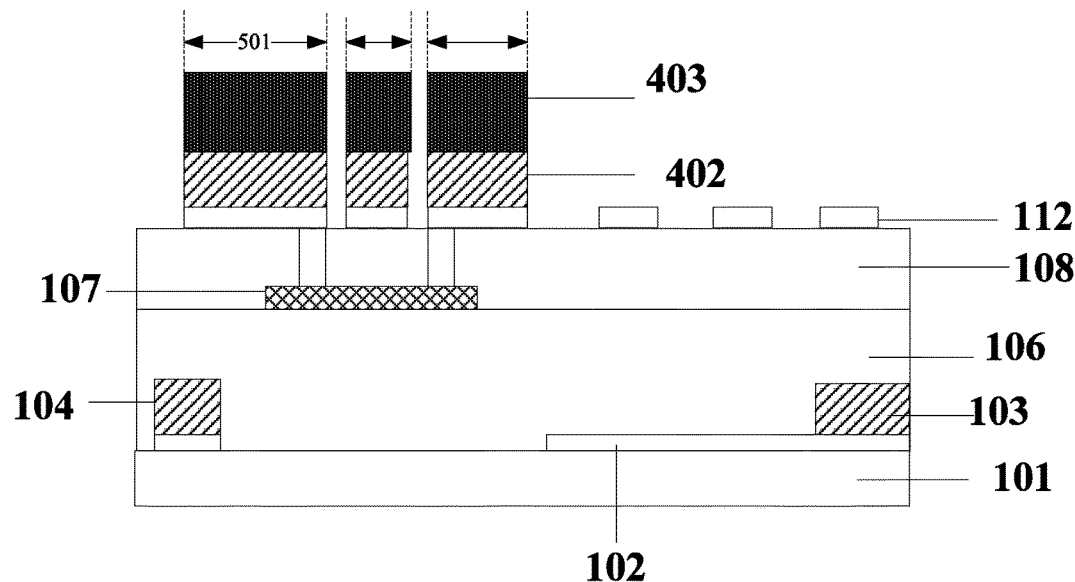
Figure 7:
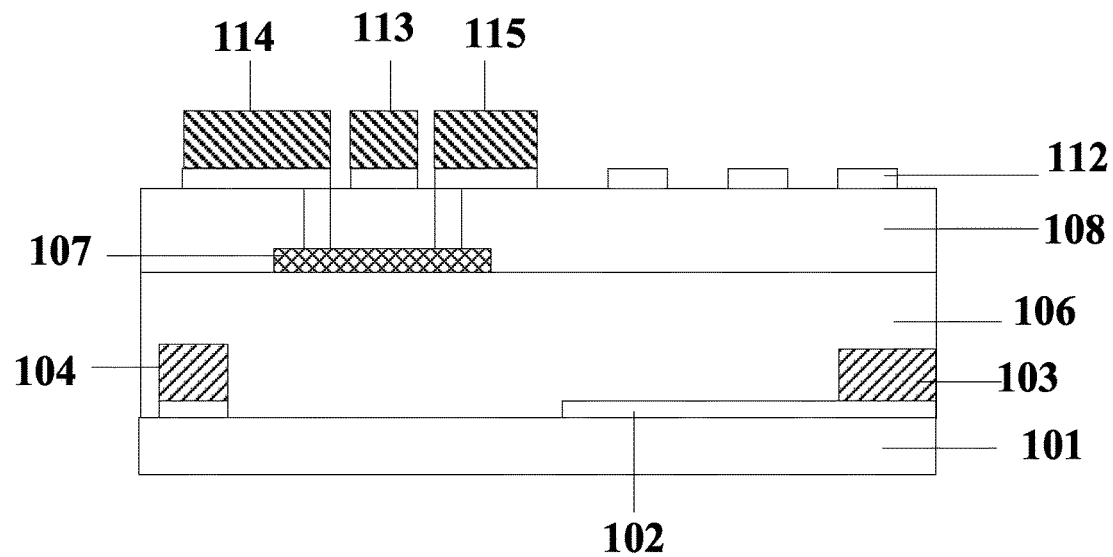

Step S17: referring to FIG. 6-7, removing the photoresist 203 at the photoresist reserved region 301 so as to expose the patterns of the common electrode line 103, the gate line 104 and the data line 105 (not shown). The common electrode line 103 is connected to the common electrode 102, the data line 105 is interrupted at the joint between the data line 105 and the gate line 104 and at the joint between the data line 105 and the common electrode line 103, so as to form the plurality of data line segments (not shown) which belongs to a complete data line 105.

Alternatively, the first metal film is made of a copper-based metal. The copper-based metal is selected from the group consisting of copper, a copper-molybdenum alloy (Cu/Mo), a copper-titanium alloy (Cu/Ti), a copper-molybdenum-tungsten alloy (Cu/Mo/W), a copper-molybdenum-niobium alloy (Cu/Mo/Nb) and a copper-molybdenum-titanium alloy (Cu/Mo/Ti).

The copper-based metal is of a low resistance, so it is able to improve a signal transmission rate for the common electrode line 103, the gate line 104 and the data line 105, thereby to improve the display quality. In addition, in the resultant TFT array substrate, there is no copper-based metal electrode on and under the active layer 107, so it is able to prevent the performance of the TFT from being adversely affected due to the diffusion of copper.

According to the above-mentioned method, merely one etching process is required to be performed on the copper-based metal film so as to form the common electrode line 103, the gate line 104 and the data line 105, so it is able to reduce the defects caused by the etching.

Step S5 of forming the patterns of the pixel electrode 112, the gate electrode 113, the source electrode 114 and the drain electrode 115 on the substrate with the gate insulating layer 108 by a single patterning processing may include the following steps.

Step S51: referring to FIG. 7-1, forming a second transparent conductive film 401 and a second metal film 402 sequentially on the substrate 101 with the gate insulating layer 108. To be specific, the second transparent conductive film 401 may be made of a metal oxide such as ITO, IZO or AZO, deposited by magnetron sputtering, and have a thickness of 30 to 50 nm. The second metal film 402 may be of a thickness of 200 to 300 nm, and mad of a metal with stable performances, such as Al, Mo or W.

Step S52: referring to FIG. 7-2, applying a photoresist 403 onto the second metal film 402.

Step S53: referring to FIG. 7-3, exposing and developing the photoresist 403 with a gray-tone or half-hone mask plate, so as to form a photoresist reserved region 501 corresponding to a region where the patterns of the gate electrode 113, the source electrode 114, the drain electrode 115 and connection parts of the data line are located, a photoresist partially-reserved region 502 corresponding to a region where the pattern of the pixel electrode 112 is located, and a photoresist unreserved region 503 corresponding to a region other than the photoresist reserved region 501 and the photoresist partially-reserved region 502.

Step S54: referring to FIG. 7-4, etching off the second metal film 402 and the second transparent conductive film 401 at the photoresist unreserved region 503 by an etching process.

Step S55: referring to FIG. 7-5, removing the photoresist 403 at the photoresist partially-reserved region 502 by an ashing process.

Step S56: referring to FIG. 7-6, etching off the second metal film 402 at the photoresist partially-reserved region 502 by an etching process, so as to form the pattern of the pixel electrode 112.

Step S57: referring to FIGS. 7-7 and 5-2, removing the photoresist 403 at the photoresist reserved region 501, so as to expose the patterns of the gate electrode 113, the source electrode 114, the drain electrode 115 and the connection parts 116 of the data line. The gate electrode 113 is electrically connected to the gate line 104 through the first via-hole 109, the source electrode 114 is electrically connected to the active layer 107 through one of the two third via-holes 111, the drain electrode 115 is electrically connected to the active layer 107 through the other one of the two third via-holes 111, and the data line segments are electrically connected to each other through the plurality of second via-holes 110 using the connection parts of the data line so as to form a complete data line 105.

In the embodiments of the present disclosure, the connection part 116 of the data line consists of two layers, i.e., a transparent conductive film and a metal film. Of course, in the other embodiments, the connection part 116 of the data line may merely consist of the transparent conductive film. At this time, at Step S53, the photoresist reserved region 501 corresponds to the region where the patterns of the gate electrode 113, the source electrode 114 and the drain electrode 115 are located, and the photoresist partially-reserved region 502 corresponds to the region where the patterns of the pixel electrode 112 and the connection parts of the data line are located.

In the above embodiments, the transparent metal film may be made of a metal oxide such as ITO or IZO.

Figure 8:
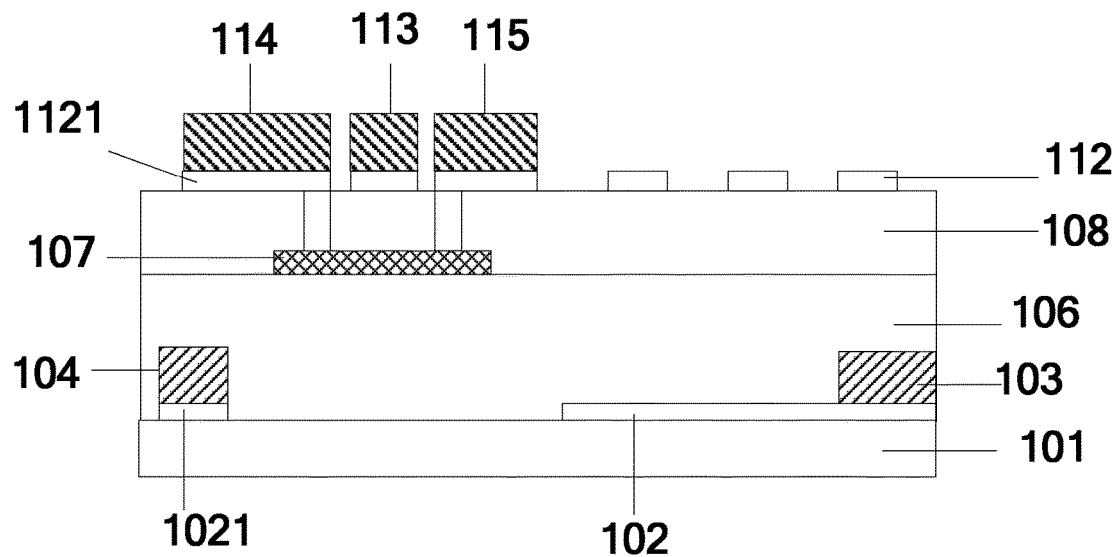
FIG. 8 is a schematic view showing the TFT array substrate according to one embodiment of the present disclosure.

Referring to FIGS. 5-2 and 8, the present disclosure further provides in one embodiment the TFT array substrate, which includes: the substrate 101; the common electrode 102 arranged on the substrate 101; the common electrode line 103, the gate line 104 and the data line 105 arranged at an identical layer, the common electrode line 103 being arranged on the common electrode 102, and the data line 105 being interrupted at a joint between the data line 105 and the gate line 104 and at a joint between the data line 105 and the common electrode line 103 so as to form a plurality of data line segments (not shown) which belongs to a complete data line; a first transparent conductive film reservation member 1021 arranged between the substrate 101 and the gate line 104 and the data line 105, arranged at a layer identical to the common electrode 102 and made of a material identical to the common electrode 102; the insulating layer 106 covering the common electrode 102, the common electrode line 103, the gate line 104 and the data line 105; the active layer 107 arranged on the insulating layer 106; the gate insulating layer 108 covering the active layer 107, a first via-hole corresponding to the gate line 104, a plurality of second via-holes corresponding to the data line segments, and two third via-holes corresponding to the active layer 107 being provided in the gate insulating layer 108; the pixel electrode 112 arranged on the gate insulating layer 108; the gate electrode 113, the source electrode 114, the drain electrode 115 and the connection parts 116 of the data line arranged at an identical layer, the data line segments being electrically connected to each other through the plurality of second via-holes using the connection parts 116 of the data line so as to form a complete data line 105, the data line 105 being connected to the source electrode through one of the plurality of second via-holes; and a second transparent conductive film reservation member 1121 arranged between the gate insulating layer 108 and the gate electrode 113, the source electrode 114, the drain electrode 115 and the connection parts 116 of the data line, arranged at a layer identical to the pixel electrode 112 and made of a material identical to the pixel electrode 112, the gate electrode 113 being electrically connected to the gate line 104 through the first via-hole using the second transparent conductive film reservation member 1121 under the gate line 104, the source electrode 114 being electrically connected to the active layer 107 through one of the two third via-holes using the second transparent conductive film reservation member 1121 under the source electrode 114, and the drain electrode 115 being electrically connected to the active layer 107 through the other one of the two third via-holes using the second transparent conductive film reservation member 1121 under the drain electrode 115.

Alternatively, the common electrode line 103, the gate line 104 and the data line 15 are each made of a copper-based metal. The copper-based metal is selected from the group consisting of copper, a copper-molybdenum alloy, a copper-titanium alloy, a copper-molybdenum-tungsten alloy, a copper-molybdenum-niobium alloy and a copper-molybdenum-titanium alloy. The copper-based metal is of a low resistance, so it is able to improve a signal transmission rate for the common electrode line 103, the gate line 104 and the data line 105, thereby to improve the display quality. In addition, in the resultant TFT array substrate, there is no copper-based metal electrode on and under the active layer 107, so it is able to prevent the performance of the TFT from being adversely affected due to the diffusion of copper.

The present disclosure further provides in one embodiment a display device including the above-mentioned TFT array substrate.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing a thin film transistor (TFT) array substrate, comprising steps of:

forming patterns of a common electrode, a common electrode line, a gate line, a data line and a first transparent conductive film reservation member on a substrate by a single patterning process, the common electrode line, the gate line and the data line being arranged in a same layer, the common electrode line being connected to the common electrode, the data line being divided into a plurality of separate data line segments, one gate line being arranged between every two adjacent data line segments of the plurality of separate data line segments, the common electrode line being arranged between at least two adjacent data line segments of the plurality of separate data line segments that are substantially aligned along a common linear axis, the common linear axis being perpendicular to a direction of the common electrode line and to a direction of the gate line, and the first transparent conductive film reservation member being arranged between the substrate and the gate line and between the substrate and the data line, arranged in a layer where the common electrode is arranged and made of a material that the common electrode is made of;

forming an insulating layer on the substrate with the common electrode, the common electrode line, the gate line and the data line;

forming a pattern of an active layer on the substrate with the insulating layer by a single patterning process;

forming a gate insulating layer on the substrate with the pattern of the active layer, and forming in the gate insulating layer a first via-hole corresponding to the gate line, a plurality of second via-holes corresponding to the data line segments, and two third via-holes corresponding to the active layer; and forming patterns of a pixel electrode, a gate electrode, a source electrode, a drain electrode and a second transparent conductive film reservation member on the substrate with the gate insulating layer by a single patterning process, the gate electrode, the source electrode, the drain electrode and connection parts of the data line being arranged in a same layer, the second transparent conductive film reservation member being arranged between the gate insulating layer and a layer comprising the pate electrode, the source electrode, the drain electrode and the connection parts of the data line, and arranged at a layer identical to the pixel electrode in a layer where the pixel electrode is arranged and made of a material that the pixel electrode is made of, the gate electrode being electrically connected to the gate line through the first via-hole, the data line segments being electrically connected to each other through the plurality of second via-holes, the data line being electrically connected to the source electrode through one of the plurality of second via-holes, the source electrode being electrically connected to the active layer through one of the two third via-holes, and the drain electrode being electrically connected to the active layer through the other one of the two third via-holes.

2. The method according to claim 1, wherein the step of forming the patterns of the common electrode, the common electrode line, the gate line, the data line and the first transparent conductive film reservation member on the substrate by a single patterning process comprises:

forming a first transparent conductive film and a first metal film sequentially on the substrate;

applying a photoresist onto the first metal film;

exposing and developing the photoresist with a gray-tone or half-hone mask plate, so as to form a photoresist reserved region corresponding to a region where the patterns of the common electrode line, the gate line and the data line are located, a photoresist partially-reserved region corresponding to a region where the common electrode is located, and a photoresist unreserved region corresponding to a region other than the photoresist reserved region and the photoresist partially-reserved region;

etching off the first metal film and the first transparent conductive film at the photoresist unreserved region by an etching process;

removing the photoresist at the photoresist partially-reserved region by an ashing process;

etching off the first metal film at the photoresist partially-reserved region by an etching process, so as to form the pattern of the common electrode; and removing the photoresist at the photoresist reserved region so as to expose the patterns of the common electrode line, the gate line and the data line.

3. The method according to claim 2, wherein the first metal film is made of a copper-based metal.

4. The method according to claim 3, wherein the copper-based metal is selected from the group consisting of copper, a copper-molybdenum alloy, a copper-titanium alloy, a copper-molybdenum-tungsten alloy, a copper-molybdenum-niobium alloy and a copper-molybdenum-titanium alloy.

5. The method according to claim 1, wherein the step of forming the patterns of the pixel electrode, the gate electrode, the source electrode, the drain electrode and the second transparent conductive film reservation member on the substrate with the gate insulating layer by a single patterning processing comprises:

forming a second transparent conductive film and a second metal film sequentially on the substrate with the gate insulating layer;

applying a photoresist onto the second metal film;

exposing and developing the photoresist with a gray-tone or half-hone mask plate, so as to form a photoresist reserved region corresponding to a region where the patterns of the gate electrode, the source electrode, the drain electrode and connection parts of the data line are located, a photoresist partially-reserved region corresponding to a region where the pattern of the pixel electrode is located, and a photoresist unreserved region corresponding to a region other than the photoresist reserved region and the photoresist partially-reserved region;

etching off the second metal film and the second transparent conductive film at the photoresist unreserved region by an etching process;

removing the photoresist at the photoresist partially-reserved region by an ashing process;

etching off the second metal film at the photoresist partially-reserved region by an etching process, so as to form the pattern of the pixel electrode; and removing the photoresist at the photoresist reserved region, so as to expose the patterns of the gate electrode, the source electrode, the drain electrode and the connection parts of the data line, the data line segments being electrically connected to each other through the plurality of second via-holes using the connection parts of the data line.

6. A thin film transistor (TFT) array substrate, comprising:

a substrate;

a common electrode arranged on the substrate;

a common electrode line, a gate line and a data line arranged in a same layer, the common electrode line being arranged on the common electrode, and the data line being divided into a plurality of separate data line segments, one gate line being arranged between every two adjacent data line segments of the plurality of separate data line segments, the common electrode line being arranged between at least two adjacent data line segments of the plurality of separate data line segments that are substantially aligned along a common linear axis, and the common linear axis being perpendicular to a direction of the common electrode line and to a direction of the gate line;

a first transparent conductive film reservation member arranged between the substrate and the gate line and between the substrate and the data line, arranged in a layer where the common electrode is arranged and made of a material that the common electrode is made of;

an insulating layer covering the common electrode, the common electrode line, the gate line and the data line;

an active layer arranged on the insulating layer;

a gate insulating layer disposed over the active layer, wherein a first via-hole corresponding to the gate line, a plurality of second via-holes corresponding to the data line segments, and two third via-holes corresponding to the active layer are provided in the gate insulating layer;

a pixel electrode arranged on the gate insulating layer;

a gate electrode, a source electrode, a drain electrode and connection parts of the data line arranged in a same layer, the data line segments being electrically connected to each other through the plurality of second via-holes using the connection parts of the data line, the data line being connected to the source electrode through one of the plurality of second via-holes; and a second transparent conductive film reservation member arranged between the gate insulating layer and a layer comprising the gate electrode, the source electrode, the drain electrode and the connection parts of the data line, and arranged in a layer where the pixel electrode is arranged and made of a material that the pixel electrode is made of, the gate electrode being electrically connected to the gate line through the first via-hole using the second transparent conductive film reservation member under the gate electrode, the source electrode being electrically connected to the active layer through one of the two third via-holes using the second transparent conductive film reservation member under the source electrode, and the drain electrode being electrically connected to the active layer through the other one of the two third via-holes using the second transparent conductive film reservation member under the drain electrode.

7. The TFT array substrate according to claim 6, wherein the common electrode line, the gate line and the data line are each made of a copper-based metal.

8. The TFT array substrate according to claim 7, wherein the copper-based metal is selected from the group consisting of copper, a copper-molybdenum alloy, a copper-titanium alloy, a copper-molybdenum-tungsten alloy, a copper-molybdenum-niobium alloy and a copper-molybdenum-titanium alloy.

9. A display device comprising TFT array substrate according to claim 6.

10. A display device comprising TFT array substrate according to claim 7.

11. A display device comprising TFT array substrate according to claim 8.

\* \* \* \* \*